United States Patent
Ho et al.

(10) Patent No.: US 8,190,952 B2
(45) Date of Patent: May 29, 2012

(54) BITMAP CLUSTER ANALYSIS OF DEFECTS IN INTEGRATED CIRCUITS

(75) Inventors: Tom T. Ho, San Carlos, CA (US); Jonathan B. Buckheit, Los Altos, CA (US); Weidong Wang, Union City, CA (US); Xin Sun, San Jose, CA (US)

(73) Assignee: Rudolph Technologies, Inc., Flanders, NJ (US)

( * ) Notice: Subject to any disclaimer, the term of this patent is extended or adjusted under 35 U.S.C. 154(b) by 0 days.

(21) Appl. No.: 12/728,629

(22) Filed: Mar. 22, 2010

(65) Prior Publication Data

US 2010/0235690 A1 Sep. 16, 2010

Related U.S. Application Data

(63) Continuation of application No. 11/166,960, filed on Jun. 23, 2005, now Pat. No. 7,685,481.

(51) Int. Cl.
*G11C 29/00* (2006.01)
(52) U.S. Cl. ........................................ 714/723
(58) Field of Classification Search ............... 714/723
See application file for complete search history.

(56) References Cited

U.S. PATENT DOCUMENTS

| 5,475,695 A | 12/1995 | Caywood et al. |
| 6,304,989 B1 | 10/2001 | Kraus et al. |
| 6,442,724 B1 | 8/2002 | Augarten |
| 6,470,229 B1 | 10/2002 | Wang et al. .................. 700/121 |
| 6,842,866 B2 | 1/2005 | Song et al. |
| 2003/0140276 A1 | 7/2003 | Sagatelian |
| 2004/0049722 A1* | 3/2004 | Matsushita .................. 714/724 |
| 2005/0047229 A1 | 3/2005 | Nadeau-Dostie et al. |

* cited by examiner

*Primary Examiner* — James C Kerveros
(74) *Attorney, Agent, or Firm* — Harrington & Smith (57) ABSTRACT

A system and method for defect analysis are disclosed wherein a defect data set is input into the system. A radius value is selected by a user, which is the maximum number of bits that bit failures can be separated from one another to be considered a bit cluster. When a defect data set is received, the system and method start with a fail bit and search for neighboring fail bits. The specified radius is used to qualify the found fail bits to be part of the bit cluster or not. If a minimum count of fail bits is not met, the system and method will stop searching and move to the next fail bit. If a minimum count of fail bits is met, the search continues for the next fail bit until the maximum fail bit count specified by the user is reached. Aggregation is provided such that once bit clusters have been classified, the number of clusters that have the exact match or partial match to each other is counted. The user may set the partial match as a threshold count to establish a match.

20 Claims, 7 Drawing Sheets

| Cluster | # Matches | # Bits | Lot | Wafer | Die_X | Die_Y | Array | Block | X0 | Y0 | X1 | Y1 |
|---|---|---|---|---|---|---|---|---|---|---|---|---|
| ▦ | 178 | 4 | SA233 | 02 | 41 | 13 | 32_0 | Global | 58 | 190 | 60 | 192 |
| | | | SA233 | 02 | 11 | 35 | 32_2 | Global | 279 | 475 | 281 | 477 |
| | | | SA233 | 02 | 11 | 35 | 32_2 | Global | 282 | 189 | 284 | 191 |
| | | | SA233 | 02 | 11 | 35 | 32_2 | Global | 419 | 359 | 421 | 361 |
| | | | SA233 | 02 | 11 | 7 | 32_2 | Global | 178 | 379 | 180 | 381 |
| | | | SA233 | 02 | 12 | 14 | 32_1 | Global | 305 | 149 | 307 | 151 |
| | | | SA233 | 02 | 12 | 14 | 32_1 | Global | 488 | 411 | 490 | 413 |
| | | | SA233 | 02 | 12 | 41 | 32_2 | Global | 165 | 444 | 167 | 446 |
| | | | SA233 | 02 | 12 | 41 | 32_2 | Global | 169 | 33 | 171 | 35 |
| | | | SA233 | 02 | 12 | 41 | 32_2 | Global | 413 | 308 | 415 | 310 |
| | | | SA233 | 02 | 14 | 3 | 32_2 | Global | 229 | 177 | 231 | 179 |
| | | | SA233 | 02 | 16 | 17 | 32_0 | Global | 177 | 207 | 179 | 209 |
| | | | SA233 | 02 | 16 | 17 | 32_0 | Global | 213 | 21 | 215 | 23 |
| | | | SA233 | 02 | 16 | 17 | 32_0 | Global | 227 | 147 | 229 | 149 |
| | | | SA233 | 02 | 16 | 17 | 32_0 | Global | 478 | 421 | 480 | 423 |
| | | | SA233 | 02 | 16 | 21 | 32_1 | Global | 47 | 110 | 49 | 112 |
| | | | SA233 | 02 | 16 | 21 | 32_1 | Global | 53 | 349 | 55 | 351 |
| | | | SA233 | 02 | 16 | 21 | 32_1 | Global | 114 | 430 | 116 | 432 |
| | | | SA233 | 02 | 17 | 14 | 32_0 | Global | 112 | 155 | 114 | 157 |

FIG. 8

BITMAP CLUSTER ANALYSIS OF DEFECTS IN INTEGRATED CIRCUITS

CROSS-REFERENCE:

This continuation patent application claims priority under 35 U.S.C. §120 from U.S. patent application No. 11/166,960, filed Jun. 23, 2005, now issued as U.S. Pat. No.7,685,481 B2, the disclosure of which is incorporated by reference herein in its entirety.

BACKGROUND OF THE INVENTION

1. Field of the Invention

The present invention relates generally to a system and method for quality control of integrated circuits manufactured by a semiconductor manufacturing process and, more particularly, to a system and method for analyzing defects in integrated circuits manufactured using a semiconductor fabrication process.

2. Description of the Prior Art

The semiconductor manufacturing industry is continually evolving its fabrication processes and developing new processes to produce smaller and smaller geometries of the semiconductor devices being manufactured, because smaller devices typically generate less heat and operate at higher speeds than larger devices. Currently, a single integrated circuit chip may contain over one billion patterns. The occurrence of defects may cause lower yield in the final semiconductor product, where yield may be defined as the number of functional devices produced by the process as compared to the theoretical number of devices that could be produced assuming no bad devices.

Improving yield is a critical problem in the semiconductor manufacturing industry and has a direct economic impact on it. In particular, a higher yield translates into more devices that may be sold by the manufacturer, and greater profits.

Typically, semiconductor manufacturers collect data about various defects and analyze the data and, based on data analysis, adjust the integrated circuit design or process steps or tool specifications in an attempt to improve the yield of the process. This has created a need for a new generation of tools and techniques for defect analysis for semiconductor yield management.

U.S. Pat. No. 6,470,229 B1 assigned to the same assignee as the present application discloses a yield management system and technique to generate a yield model. The system can also accept user input to modify the generated model.

Additionally, a Genesis™ Bitmap Analysis product module is commercially available from the assignee of U.S. Pat. No. 6,470,229 B1 to extend the capabilities of the yield management system to direct bitmap-level analysis. The Bitmap Analysis product module suite allows a user to graph and analyze bitmap data. Bit failures are revealed to the user visually with interactive bitmaps. Analysis is performed on classified bitmap pattern information imported into a data sheet. Patterns may consist of single-bit fails, dual bits, rows, columns, etc. A general instance of a fail is described internally preferably using a list of one or more bounding rectangles to specify the set of bits that failed. Each bounding rectangle is specified by the bit coordinates of the lower-left and upper-right corners of the rectangle.

Information on each of a die's bit failures can be viewed by toggling an "N of (total number of bit fails)" list in a Bit-Fail Browser. The following information may be displayed for each bit failure:

Array—the array where the bit failure occurred.
Block—the block where the bit failure occurred.
Pattern—the bit-fail pattern associated with the bit failure. If the bit failure is not associated with a defined bit-fail pattern, this field will be grayed out.
Bit Count—this field specifies the total number of bits that failed in the defined rectangle associated with the bit-fail pattern. The rectangle is defined by Array, Block, and physical coordinates (X0, Y0) and (X1, Y1).
Sub-Pattern—the index of the bounding rectangle(s) in the bit-fail pattern. Each sub-pattern has a range.
Range—the X0, X1, Y0, and Y1 coordinates describe the lower-left corner (X0, Y0) and the upper-right corner (X1, Y1) of the bounding rectangle associated with the current sub-pattern. These coordinates are in units of bits from the lower-left corner of the array/block.
Match—if this option is checked by a user, the bit failure has been matched to a known defect.
Reticle Repeater—if this option is checked by the user, the bit failure is repeating on the same reticle.

Random failed bits are common in memory devices and in embedded memory in system-on-chip integrated circuits. Failed bits are typically classified into a pattern name using a rigid predefined group of bits. Some examples of common predefined patterns are "single bit," "pair bits," "group of bits," etc. These predefined patterns allow a bitmap classifier to identify and match a group of bits to the patterns. There are two major problems that arise with this technique.

First, random individual bits and groups of bits that fail near each other are typically caused by the same process event and should be classified to the same pattern, rather than many individual patterns. Second, these seemingly random individual bits and groups of bits are sometimes systematic in nature, meaning that they almost always failed certain ways. If the patterns are not defined ahead of time, these systematic cluster bits will not be identified in a timely manner. New memory design and new memory testing techniques may produce these systematic patterns, unknowingly to the user.

Thus, it would be desirable to provide a defect analysis system and method which overcome the above limitations and disadvantages of conventional systems and facilitate bitmap analysis leading to more effective quality control. It is to this end that the present invention is directed. The various embodiments of the bit clustering and aggregation system and method in accordance with the present invention address the two aforementioned problems and provide many advantages over conventional defect bitmap analysis systems and techniques.

SUMMARY OF THE INVENTION

One embodiment of the bit clustering and aggregation system and method in accordance with the present invention provides many advantages over conventional bitmap analysis systems and techniques, which make the bit clustering and aggregation system and method in accordance with the present invention more useful to semiconductor manufacturers. The bit clustering and aggregation system and method in accordance with the various embodiments of the present invention identify random and systematic bitmap failed patterns. The system may be fully automated and is easy to use, so that no extra training is necessary to make use of the bit clustering and aggregation system. The system generates an output preferably in the form of a bit cluster analysis report that is easy to interpret and understand.

In accordance with one preferred embodiment of the present invention, clustering is provided such that when defining a bit cluster pattern, a user has the following options: 1) selecting a radius specified by a number of "good" bits away from another fail bit before the current fail bit can be classified as part of the original bit cluster; 2) selecting a minimum count of fail bits in a bit cluster; and 3) selecting a maximum count of fail bits in a bit cluster. One embodiment of the bit clustering and aggregation system and method in accordance with the present invention may receive a defect data set. When a defect data set is received, the bit clustering and aggregation system and method in accordance with the present invention starts with a fail bit and searches for neighboring fail bits. The bit clustering and aggregation system and method use the specified radius to qualify the found fail bits to be part of the cluster or not. If the minimum count of fail bits is not met, the bit clustering and aggregation system and method will stop searching and move to the next fail bit. If the minimum count of fail bits is met, the bit clustering and aggregation system and method will continue to search for the next fail bit until it reaches the maximum fail bit count specified by the user. Aggregation is provided such that once clusters have been classified, the number of clusters that have the exact match or partial match to each other is counted. The user has the option to preferably set the partial match as a threshold count to establish a match. The bit clustering and aggregation system and method in accordance with the present invention provide a defect bitmap analysis tool that is more powerful and flexible than conventional tools.

The foregoing and other objects, features, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figures of the drawing to facilitate an understanding of the present invention. In the figures, like reference numerals refer to like elements. In the drawing.

DETAILED DESCRIPTION OF THE PREFERRED EMBODIMENTS

The present invention is particularly applicable to a computer-implemented software-based defect analysis system and method, and it is in this context that the various embodiments of the present invention will be described. It will be appreciated, however, that the defect analysis system and method in accordance with the present invention have greater utility, since they may be implemented in hardware or may incorporate other modules or functionality not described herein.

Figure 1:
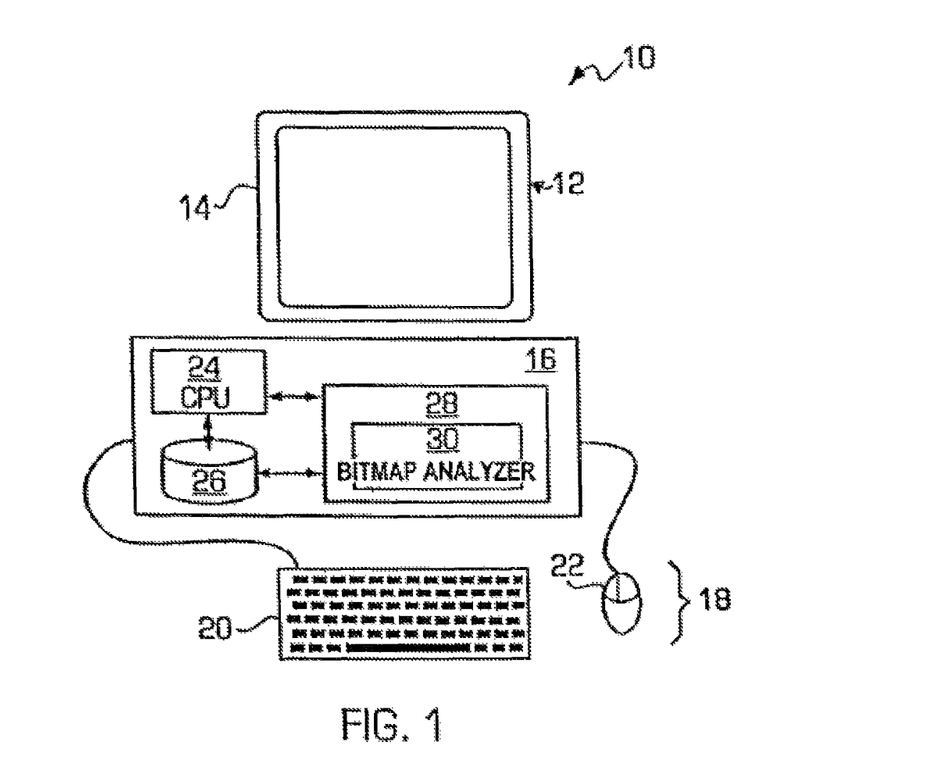
FIG. 1 is a diagram illustrating an example of a bit clustering and aggregation system in accordance with one embodiment of the present invention implemented on a personal computer.

FIG. 1 is a block diagram illustrating an example of a defect analysis system 10 in accordance with one embodiment of the present invention implemented on a personal computer 12. In particular, the personal computer 12 may include a display unit 14, which may be a cathode ray tube (CRT), a liquid crystal display, or the like; a processing unit 16; and one or more input/output devices 18 that permit a user to interact with the software application being executed by the personal computer. In the illustrated example, the input/output devices 18 may include a keyboard 20 and a mouse 22, but may also include other peripheral devices, such as printers, scanners, and the like. The processing unit 16 may further include a central processing unit (CPU) 24, a persistent storage device 26, such as a hard disk, a tape drive, an optical disk system, a removable disk system, or the like, and a memory 28. The CPU 24 may control the persistent storage device 26 and memory 28. Typically, a software application may be permanently stored in the persistent storage device 26 and then may be loaded into the memory 28 when the software application is to be executed by the CPU 24. In the example shown, the memory 28 may contain a bitmap analyzer 30. The bitmap analyzer 30 may be implemented as one or more software applications that are executed by the CPU 24.

In accordance with the present invention, the defect analysis system 10 may also be implemented using hardware and may be implemented on different types of computer systems, such as client/server systems, Web servers, mainframe computers, workstations, and the like. Now, more details of an exemplary implementation of the defect analysis system 10 in software will be described.

Figure 2:
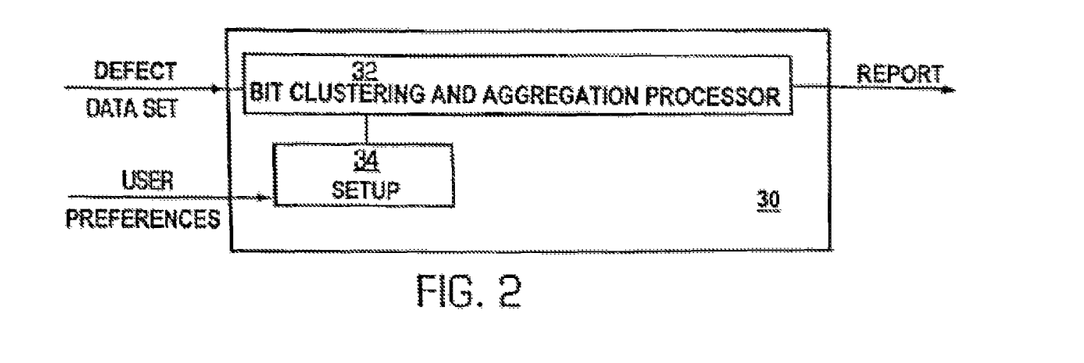
FIG. 2 is a block diagram illustrating more details of the bit clustering and aggregation system in accordance with the embodiment of the invention shown in FIG. 1.

FIG. 2 is block diagram illustrating more details of the bitmap analyzer 30 in accordance with one embodiment of the present invention. In particular, the bitmap analyzer 30 may receive a defect data set containing various types of semiconductor process defect data of the particular semiconductor device or integrated circuit being inspected. For example, the data may be produced by a memory tester that extracts bits from memory chips or a liquid crystal display (LCD) tester that extracts bits from an LCD. The bitmap analyzer 30 may process the defect data set and generate an output that may indicate, for example, the location of clusters of defects that affected the yield of the devices that generated the current defect data set.

Considered in more detail, as shown in FIG. 2, the defect data set may be input to a bit clustering and aggregation processor 32 that analyzes the data and identifies clusters of defects. The user may preferably enter preferences using a setup module 34 to define the attributes of a bit cluster. Once user preferences have been incorporated, an analysis of the defect data set may be automatically performed by the bit clustering and aggregation processor 32. The output of the bitmap analyzer 30 may be, for example, a listing of one or more clusters of failed bits that affect the yield of the devices that generated the defect data set being analyzed. Now, a bit clustering and aggregation method in accordance with one embodiment of the present invention will be described.

The bit clustering and aggregation system and method in accordance with the embodiments of the present invention are preferably used as a companion to the yield management system and technique disclosed in aforementioned U.S. Pat. No. 6,470,229 B1, the disclosure of which is hereby incorporated in its entirety herein by this reference. Brief descriptions of the primary functions of the yield management system and technique disclosed in aforementioned U.S. Pat. No. 6,470,229 B1, such as how to use preferences, set up and run analyses, and interpret results, will be summarized prior to describing using the bitmap analyzer 30.

Figure 3:
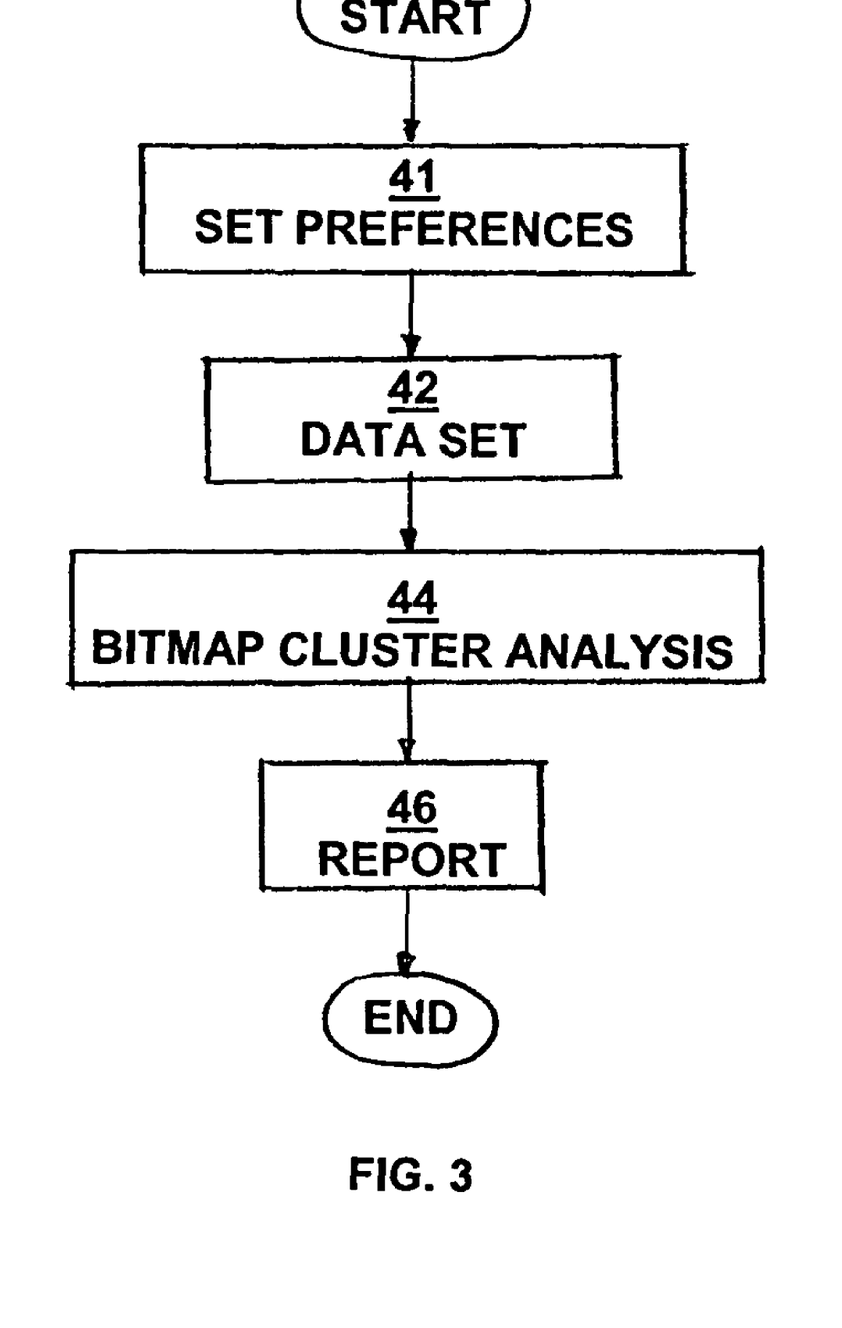
FIG. 3 is a flowchart illustrating an example of a bit clustering and aggregation method in accordance with one embodiment of the present invention.

The bit clustering and aggregation system and method in accordance with the preferred embodiment of the present invention preferably perform an analysis of defect data and generate a report of bit-fail cluster data. FIG. 3 is a flowchart illustrating an example of a bit clustering and aggregation method 40 in accordance one embodiment of the present invention. The method may include setting preferences, as indicated by a step 41 shown in FIG. 3, and receiving a defect data set, as indicated by a step 42 shown in FIG. 3.

As indicated by a step 44 shown in FIG. 3, the defect data set may be analyzed to identify bit-fail cluster patterns. Once the analysis is complete, a report, for example, a Bitmap Cluster Analysis report, can be generated, as indicated by a step 46 shown in FIG. 3. Each of the above steps will now be described in more detail to provide a better understanding of the method in accordance with the various embodiments of the present invention. In particular, the preference setting step 41 in accordance with the method of the present invention will now be described.

Cluster patterns must be defined in the Edit Bitmap Patterns and Layout application before a Bitmap Cluster Analysis report can be generated, as will now be described. In order to edit patterns and layout, names and descriptions of bit-fail patterns and pattern groups may be created and saved as Genesis Bitmap Pattern (*.gbp) files. Setup information for arrays and blocks can be created and saved as Genesis Bitmap Layout (*.gbl) files.

A Bitmap Pattern (.gbp) file is comprised of a collection of bitmap pattern classifications. A Bitmap Pattern file can consist of as little as one bitmap pattern, or as many as 30 or more.

Bitmap Pattern (.gbp) files can be attached to bit-fail data sheets, or loaded from a Bitmap Pattern Editor. Bitmap patterns within a .gbp file can be added and modified from the Bitmap Pattern Editor. Adding bitmap patterns will now be described.

Bitmap patterns are added and modified through the Bitmap Pattern Editor. There are numerous steps involved in defining a bitmap pattern, especially if the pattern is complex. The tasks involved in defining a bitmap pattern are as follows. Defining a bitmap pattern requires a user to follow the steps below to add a bitmap pattern to the Bitmap Pattern (.gbp) file.

Figure 4:
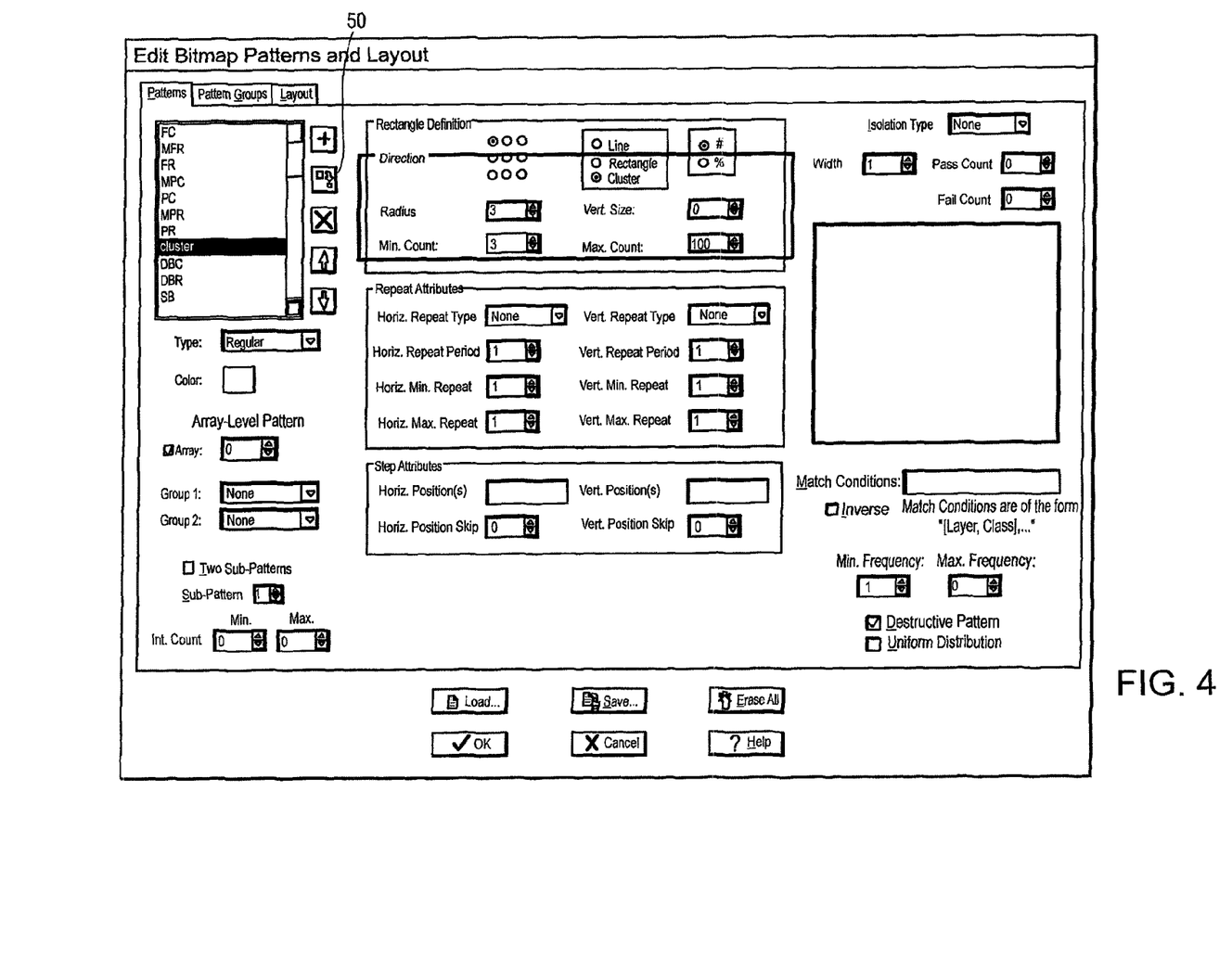
FIG. 4 illustrates an Edit Bitmap Patterns and Layout screen displayed in conjunction with one embodiment of the bit clustering and aggregation system and method of the present invention.

1. From a Bitmap Analysis menu, the user selects Edit Bitmap Patterns and Layout, as shown in FIG. 4. Unless there is an existing .gbp file attached to the current data sheet, all options on the Edit Bitmap Patterns and Layout screen shown in FIG. 4 will be grayed out until a pattern is defined, or an existing Bitmap Pattern file is loaded. If an existing .gbp file is attached to the open data sheet, the Edit Bitmap Patterns and Layout screen will load with the attached .gbp file opened.

2. To add a new pattern to the list box, the user clicks the (+) button and then inputs a name for the new pattern to be defined. The pattern name will be added to the list box, and all options will be available for modification. Each additional pattern is added to the list box the same way. As shown in FIG. 4, the pattern to be added in accordance with the bit clustering and aggregation system and method in accordance with one embodiment of the present invention is "cluster".

To duplicate a pattern (same rectangle definition, attributes, and options), the user selects the pattern to duplicate in the list box, and then clicks a Duplicate Pattern button 50. Once the new pattern is given a name, it will appear in the list box. The user can then make any changes to the new pattern. This time-saving feature can be useful when defining patterns that are very similar.

To remove a pattern from the list box, the user selects the pattern and then clicks the (X) button. To rearrange the order of the bitmap patterns, the user selects the pattern and then uses the up and down arrows.

3. Preferably, each bitmap pattern has an associated color. To modify the color for a pattern, the user clicks a Color box and selects another color from the palette.

4. By default, a Bitmap Classifier searches for bitmap patterns block-by-block. To direct the Bitmap Classifier to search only for bitmap patterns spanning entire arrays, the user selects an Array-Level Pattern check box. If the Array-Level Pattern option is selected, bitmap patterns that do not span an entire array(s) will not be considered.

To search for array-level bitmap patterns in a specific array, the user inputs (or toggles) that array number into an Array field. If the Array field is set to 0, as shown in FIG. 4, the behavior is to search all arrays in the bitmap.

5. To assign a bitmap pattern to a pattern group (rows, columns, double columns, etc.), the user selects the pattern and then selects the pattern group from the Group 1 or Group 2 drop-down list.

6. The user also sets the frequency range. In accordance with one embodiment of the bit clustering and aggregation system and method of the present invention, the default for Min. Frequency and Max. Frequency is 0.

7. The user toggles the Destructive Pattern option, according to whether or not the pattern is destructive, respectively.

8. If desired, Match Conditions may be specified by the user for a specific defect layer name and defect classification number combination. A bitmap pattern must be found at the specified layer and defect classification to satisfy the pattern. Wildcards are allowed, and multiple pairs may be listed if separated by commas. If the Inverse option is selected by the user, the inverse conditions apply.

Once the initial steps (above) are completed, it is then time to define the region(s) and all its attributes. Insofar as defining a pattern region is concerned, to define a region for a bitmap pattern, the user follows the steps below.

1. The user selects the "Cluster" region type. With cluster patterns, the user only sets up the search parameters, and then the cluster patterns are discovered through the Cluster Analysis application.

2. The scan direction is preselected to be right to left and top to bottom, as indicated by the selected Direction radio button. The scan direction defines the direction in which bits will be scanned.

3. By default, the Min. Count and Max. Count options are set to 0, meaning that every bit contained in the cluster region must be failed to satisfy the pattern. If the Min. Count is set to 5 and the Max. Count is set to 25, between five and 25 failed bits must exist in the cluster region to satisfy the pattern.

In the Repeat Attributes section, the Horiz. Repeat Type and Vert. Repeat Type are defaulted to "None". Also, insofar as the Step Attributes are concerned, the Horiz. Position(s) and Vert. Position(s) fields are left blank, which indicates that all bits will be scanned (starting at bit 0). In the Isolation Type section, the isolation type is defaulted to "None". The Two Sub-Patterns option is not available for bitmap clusters.

Additional bitmap pattern options are also available. The user may click the Load button to load an existing Bitmap Pattern (.gbp) file. The patterns contained in this file can then be modified. Also, the user may click the Save button to save the exiting set of patterns (and attributes) as a Bitmap Pattern (.gbp) file. Additionally, the user may double-click a pattern name inside the list box to modify the name. Clicking the Erase All button will erase all patterns (and attributes) from the dialog box. However, this action will only affect the current .gbp file if the user "overwrites" that file using the Save feature.

In accordance with the bit clustering and aggregation system and method in accordance with one embodiment of the present invention with cluster patterns, the following options are available for a bitmap cluster:

Color—all discovered bitmap clusters will be associated with this color. To modify the color, the user clicks the Color box and selects another color from the palette.

Array (number)—to search for bitmap clusters in a specific array, the user inputs or toggles that array number into the Array field. If the Array field is set to 0, the behavior is to search all arrays in the bitmap.

(Pattern) Group 1/2—to assign bitmap clusters to a pattern group, the user selects a pattern group from the Group 1 or Group 2 drop-down list.

Radius—the user inputs or toggles a radius value, which is the maximum number of bits that bit failures can be separated from one another to be considered a bit cluster.

Min. Count/Max. Count—by default, the Min. Count and Max. Count options are set to 0, meaning that every bit contained within the radius value must be failed to be considered a cluster. For example, if the Min. Count is set to 4 and the Max. Count is set to 6, between four and six failed bits must exist within the radius to be considered a bit cluster. As described above, the user sets up the search parameters, and then bit-fail cluster patterns that satisfy the parameters are identified through the Cluster Analysis application.

Figure 5:
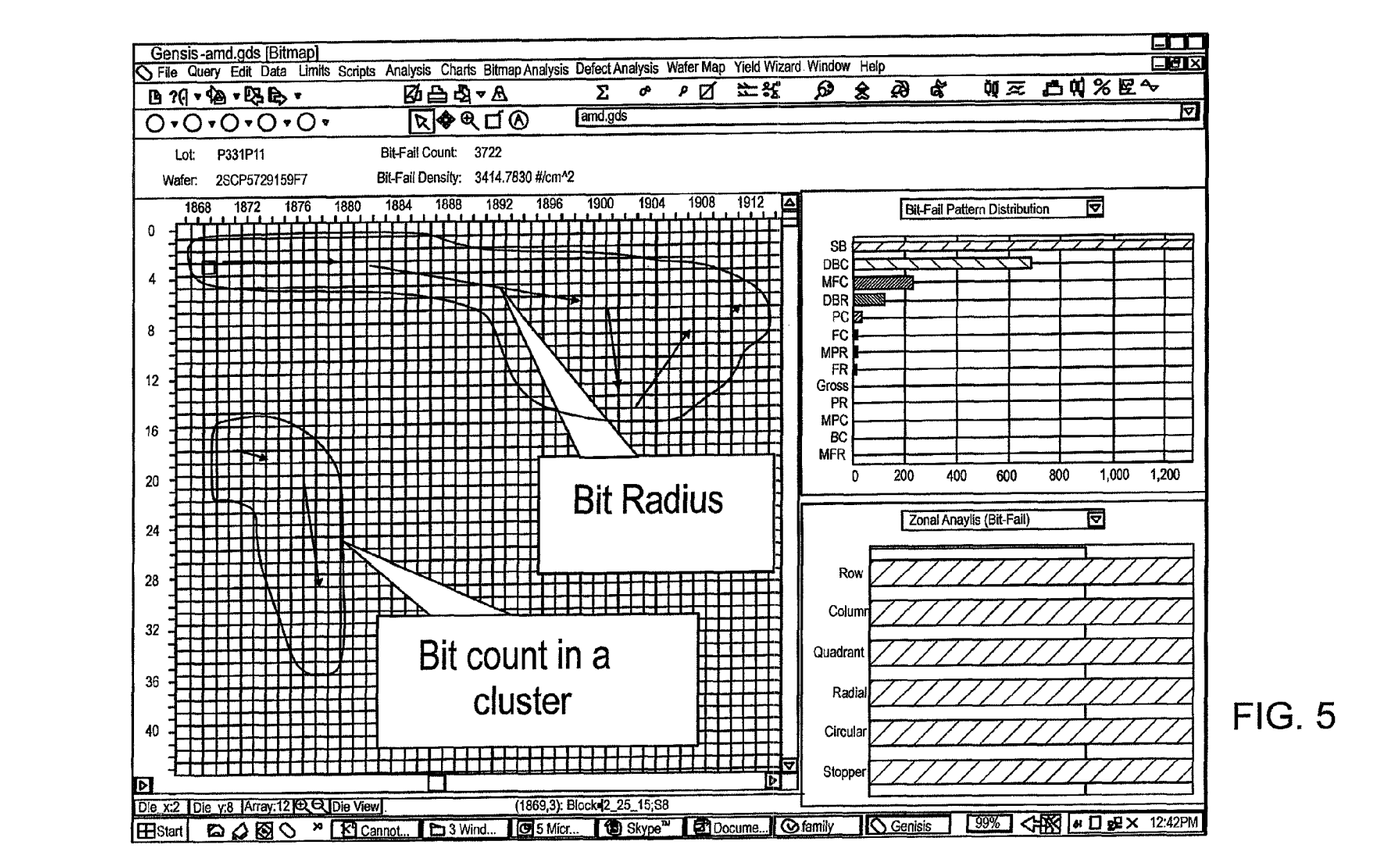
FIG. 5 illustrates a screen showing failed bit clusters displayed by one embodiment of the bit clustering and aggregation system and method of the present invention.

In summary, the bit clustering and aggregation system and method in accordance with one embodiment of the present invention provide the following available clustering options:

1. Radius—number of bit spaces between failed bits
2. Min. Count—minimum of number of failed bits in a cluster
3. Max. Count—maximum of number of failed bits in a cluster; as shown in FIGS. 4 and 5.

Figure 6:
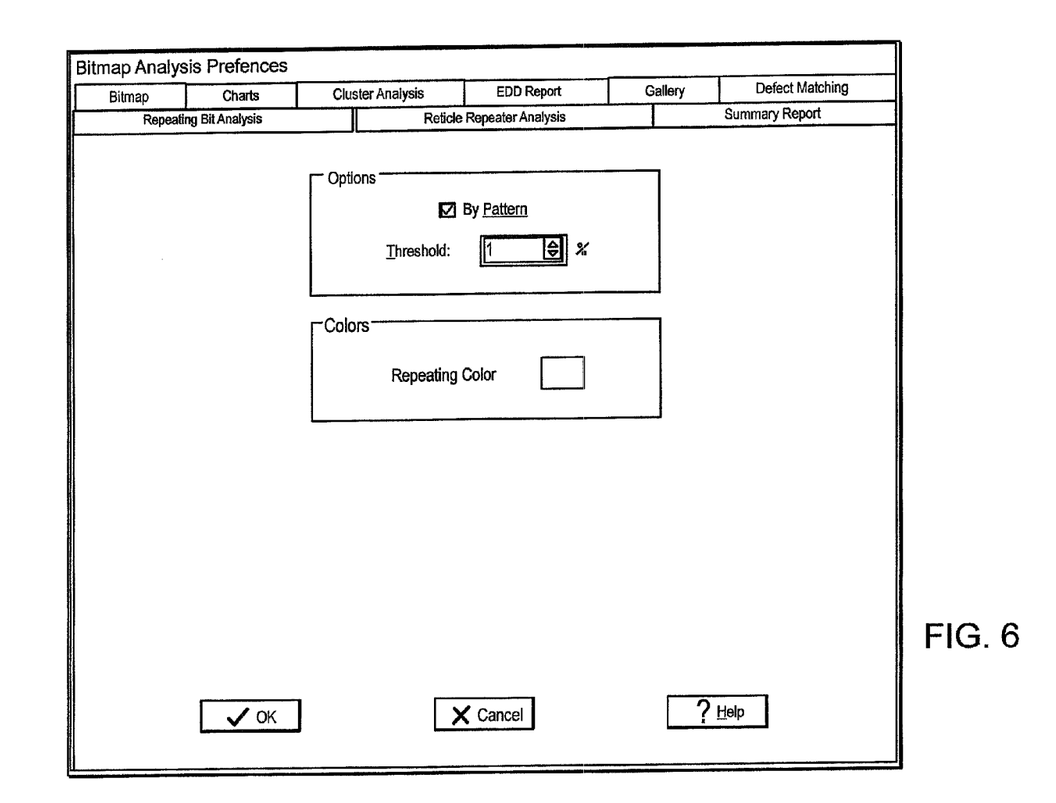
FIG. 6 illustrates a Bitmap Analysis Preferences screen displayed by one embodiment of the bit clustering and aggregation system and method of the present invention.

The bit clustering and aggregation system and method in accordance with one embodiment of the present invention preferably provide an aggregation option so that the user may specify a number of matches required. The user specifies the number of matches using Cluster Analysis preferences. To modify Cluster Analysis preferences, the user performs the following steps:

1. From the Edit menu, select Edit Preferences→Bitmap Analysis
Preferences, as shown in FIG. 6. Position the mouse pointer on the "Cluster Analysis" tab, and click. When the user clicks the "Cluster Analysis" tab, a Bit Cluster Analysis Setup screen appears, as shown in FIG. 7, to display cluster analysis preferences.

2. Input (or use toggle keys) an integer value for the matches Threshold. A bit-fail cluster must have at least this many matches to be included in the Bitmap Cluster Analysis report.

3. Click OK to save preference settings.

Figure 7:
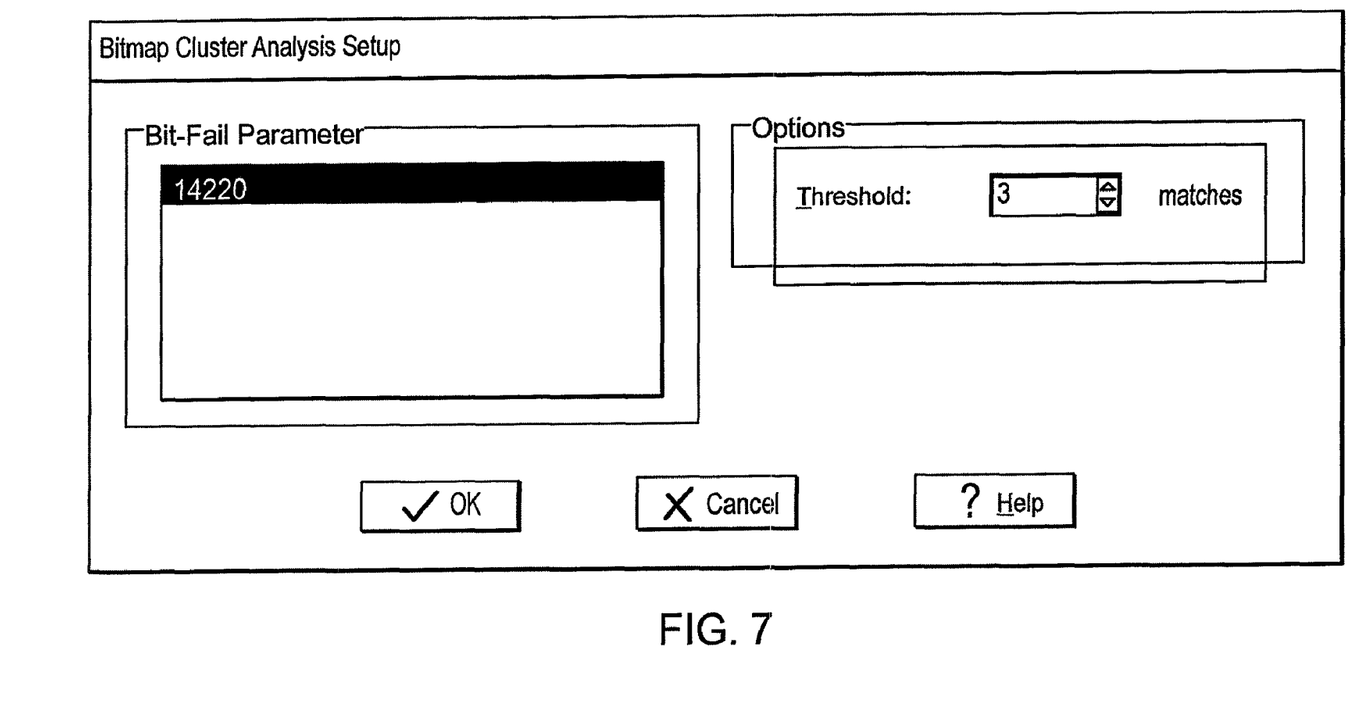
FIG. 7 illustrates a Bit Cluster Analysis Setup screen which appears when a user positions the mouse pointer on the "Cluster Analysis" tab illustrated in FIG. 6 and clicks the left mouse button.

The count Threshold shown in FIG. 7 is the number of matches required before the cluster is displayed in an analysis report. In one contemplated modification in accordance with the present invention, the user may be provided the alternative option to select a "Match % Threshold" which would correspond to a percentage of match of each cluster.

The user may now receive a defect data set, initiate a Bitmap Cluster Analysis, and create a Bitmap Cluster Analysis report, as indicated by the steps 42, 44 and 46 shown in FIG. 3, respectively. To initiate a Bitmap Cluster Analysis, the user performs the following steps:

1. Select Cluster Analysis from the Bitmap Analysis Preferences menu. The Bitmap Cluster Analysis Setup dialog box shown in FIG. 7 appears.

2. Select one parameter from the Bit-Fail Parameter list box, e.g., "14220", as shown in FIG. 7. Pattern text matching is available. The user may right-click the list box to perform a search. The user may alternatively click the F7 key on the keyboard 20 to restore the original list of parameters. Also, the user may click the F6 key on the keyboard 20 to restrict the list to marked parameters. To sort the parameters in alphanumerical order, the user may click the F8 key on the keyboard 20.

3. To modify the count Threshold, input (or use toggle keys) to select an integer value for the matches Threshold, as described earlier. A bit-fail cluster must have at least this many matches to be included in the Bitmap Cluster Analysis report.

4. Click OK to generate a Bitmap Cluster Analysis report.

Figure 8:
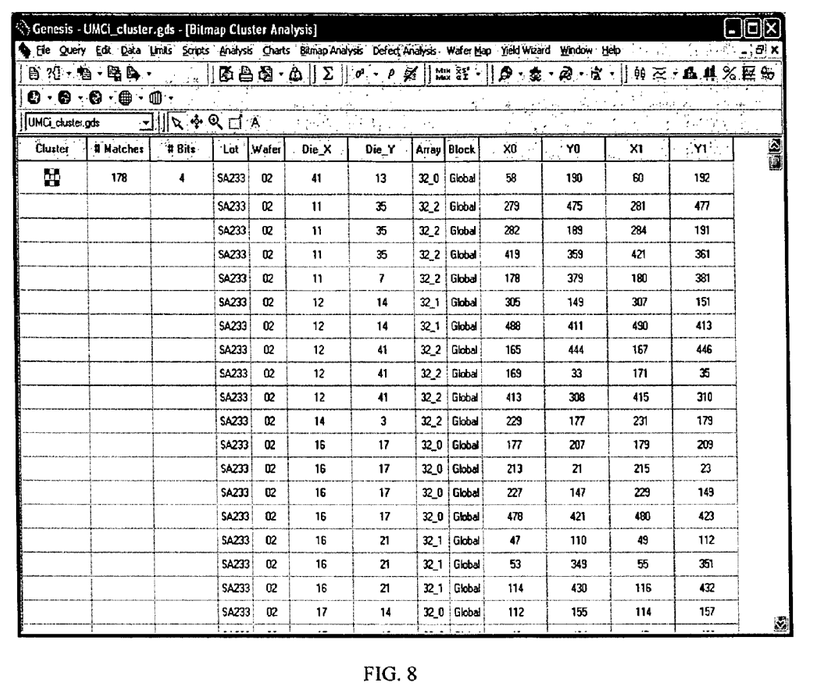
FIG. 8 illustrates a Bitmap Cluster Analysis report displayed by one embodiment of the bit clustering and aggregation system and method of the present invention.

Preferably, the resulting output of the bit clustering and aggregation system and method in accordance with one embodiment of the present invention is a Bitmap Cluster Analysis report to display Bitmap Cluster Analysis results. An example of a Bitmap Cluster Analysis report is shown in FIG. 8. All bit-fail cluster patterns that satisfied the cluster definition appear in the report. The bit-fail cluster patterns are preferably listed in descending order according to the number of matches. Each column is described below:

Cluster—shows a visualization of the cluster pattern.
Matches—the number of bit-fail patterns that match the cluster pattern.
Bits—the number of bits that constitute the pattern.
Lot—lot identification (ID).
Wafer—wafer ID.
Die_X—X-coordinate for the die location in the wafer map.
Die_Y—Y-coordinate for the die location in the wafer map.
Array—array in which the die appears.
Block—block in which the die appears.
X0—the X0-coordinate for the bit location in the die.
Y0—the Y0-coordinate for the bit location in the die.
X1—the X1-coordinate for the bit location in the die.
Y1—the Y1-coordinate for the bit location in the die.

Finally, if the user right-clicks anywhere in the Bitmap Cluster Analysis report, a pop-up menu preferably appears. The following three options are preferably available with the pop-up menu:

Find Text—opens the Find Text dialog box. Input the search string in the Find Text field, or select a previously searched string from the drop-down list. For a case-sensitive search, select the Case Sensitive check box. For a regular expression search, select the Regular Expression check box. Click the Find Next button to find the first/next occurrence of the search string.

Save Report—report can be saved as a tab-delimited text file, a Genesis data sheet (*.gds) file, or an HTML file.

Re-Display Setup Dialog—re-displays the Bitmap Cluster Analysis Setup dialog box shown in FIG. 7 with the same settings used to generate current report.

While the foregoing description has been with reference to particular embodiments of the present invention, it will be appreciated by those skilled in the art that changes in these embodiments may be made without departing from the principles and spirit of the invention, the scope of which is defined by the appended claims.

What is claimed is:

1. A bit cluster analysis system to identify random and systematic bitmap failed patterns comprising:
    means for defining bit clusters comprising:
        means for selecting a radius which is specified by a maximum number of bit spaces between a fail bit and another fail bit; and
        means for selecting a minimum count of fail bits in a bit cluster;
    means for receiving a defect data set comprising fail bits; and
    searching means for starting with a fail bit in the defect data set and finding at least one neighboring fail bit in the defect data set using the radius to qualify the found at least one neighboring fail bit to be part of the bit cluster if each of the found at least one neighboring fail bit is within the radius and a count of the fail bit and the found at least one neighboring fail bit is greater than or equal to the minimum count of fail bits,
    whereby the system will stop searching and move to a next fail bit if the minimum count of fail bits is not met within the radius.

2. The system of claim 1 wherein:
    the means for defining bit clusters comprises means for selecting a maximum count of fail bits in the bit cluster; and
    the searching means, if the minimum count of fail bits is met, will continue to search for a next fail bit until the system reaches the maximum count of fail bits.

3. The system of claim 1 further comprising means for generating a report, wherein the report is a bit cluster analysis report.

4. The system of claim 3 further comprising means for counting the number of bit clusters that have a match to each other once clusters have been classified and wherein bit-fail cluster patterns are listed in descending order according to the number of matches.

5. The system of claim 1 further comprising means for counting a number of bit clusters associated with a bit cluster pattern from the one or more bit cluster patterns.

6. The system of claim 1 wherein the defect data set is produced by a memory tester that extracts bits from memory chips.

7. The system of claim 1 wherein the defect data set is produced by a liquid crystal display tester that extracts bits from a liquid crystal display.

8. The system of claim 1 further comprising means for aggregating a plurality of bit clusters by identifying one or more bit cluster patterns from the plurality of bit clusters that have a match to each other.

9. A bit cluster analysis method to identify random and systematic bitmap failed patterns, comprising the steps of:
    defining bit clusters with a bit cluster analysis system comprising:
        selecting a radius which is specified by a maximum number of bit spaces between a fail bit and another fail bit; and
        selecting a minimum count of fail bits in a bit cluster;
    receiving, with the bit cluster analysis system, a defect data set comprising fail bits; and
    starting with a fail bit in the defect data set, with the bit cluster analysis system, and finding at least one neighboring fail bit in the defect data set using the radius to qualify the found at least one neighboring fail bit to be part of the bit cluster if each of the found at least one neighboring fail bit is within the radius and a count of the fail bit and the found at least one neighboring fail bit is greater than or equal to the minimum count of fail bits,
    whereby the bit cluster analysis system will stop searching and move to a next fail bit if the minimum count of fail bits is not met within the radius.

10. The method of claim 9 further comprising:
    selecting a maximum count of fail bits in the bit cluster; and
    if the minimum count of fail bits is met, continuing to search for a next fail bit until the bit cluster analysis system reaches the maximum count of fail bits.

11. The method of claim 9 further comprising the step of generating a report, wherein the report is a bit cluster analysis report.

12. The method of claim 11 further comprising the step of counting the number of bit clusters that have a match to each other once clusters have been classified and wherein bit-fail cluster patterns are listed in descending order according to the number of matches.

13. The method of claim 9 further comprising the step of counting a number of bit clusters associated with a bit cluster pattern from the one or more bit cluster patterns.

14. The method of claim 13 further comprising the step of enabling a user to set a threshold count to establish a partial match.

15. The method of claim 9 wherein the defect data set is produced by an integrated circuit tester that extracts bits from chips that contain a memory circuit block.

16. The method of claim 9 wherein the defect data is produced by a liquid crystal display tester that extracts bits from a liquid crystal display.

17. The method of claim 9 further comprising aggregating a plurality of bit clusters by identifying one or more bit cluster patterns from the plurality of bit clusters that have a match to each other.

18. A computer program product, tangibly embodied in a computer readable medium, the computer program product including instructions being operable to cause a data processing apparatus to:
    define bit clusters comprising:
        selecting a radius which is specified by a maximum number of bit spaces between a fail bit and another fail bit; and
        selecting a minimum count of fail bits in a bit cluster;
    receive a defect data set comprising fail bits; and
    start with a fail bit in the defect data set and finding at least one neighboring fail bit in the defect data set using the radius to qualify the found at least one neighboring fail bit to be part of the bit cluster if each of the found at least one neighboring fail bit is within the radius and a count of the fail bit and the found at least one neighboring fail bit is greater than or equal to the minimum count of fail bits,
    whereby a bit cluster analysis system will stop searching and move to a next fail bit if the minimum count of fail bits is not met within the radius.

19. The computer program product of claim 18, where the instructions are further operable to cause the data processing apparatus to:
  when defining the bit clusters, select a maximum count of fail bits in the bit cluster; and
  whereby the bit cluster analysis system will continue to search for a next fail bit until the system reaches the maximum count of fail bits, if the minimum count of fail bits is met.

20. The computer program product of claim 18, where the instructions are further operable to cause the data processing apparatus to aggregate a plurality of bit clusters by identifying one or more bit cluster patterns from the plurality of bit clusters that have a match to each other.

* * * * *